(12) United States Patent
Froment

(10) Patent No.: US 8,295,028 B2
(45) Date of Patent: Oct. 23, 2012

(54) INCREASING THE CAPACITANCE OF A CAPACITIVE DEVICE BY MICROMASKING

(75) Inventor: Benoit Froment, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 1006 days.

(21) Appl. No.: 12/074,267

(22) Filed: Feb. 29, 2008

(65) Prior Publication Data

US 2008/0278886 A1    Nov. 13, 2008

(30) Foreign Application Priority Data

Mar. 2, 2007    (FR) ..................... 07 53625

(51) Int. Cl.
*H01G 4/30*    (2006.01)

(52) U.S. Cl. .................. 361/301.4; 361/301.2; 361/311; 361/313; 361/306.1; 361/306.2

(58) Field of Classification Search ............... 361/301.4, 361/301.2, 311–313, 321.2, 303–305, 306.1, 361/306.3; 438/154, 162; 257/288, 352, 257/347, 395–396
See application file for complete search history.

(56) References Cited

U.S. PATENT DOCUMENTS

| | | | |
|---|---|---|---|
| 5,597,754 A * | 1/1997 | Lou et al. ..................... | 438/398 |
| 6,074,926 A | 6/2000 | Cathey et al. | |
| 6,258,664 B1 * | 7/2001 | Reinberg ..................... | 438/255 |
| 6,551,872 B1 * | 4/2003 | Cunningham ................ | 438/225 |
| 6,768,175 B1 * | 7/2004 | Morishita et al. ............. | 257/352 |
| 7,749,890 B2 * | 7/2010 | Wong et al. ................... | 438/621 |
| 2003/0134436 A1 | 7/2003 | Yates et al. | |
| 2008/0116494 A1 * | 5/2008 | Goldbach et al. ............. | 257/288 |

OTHER PUBLICATIONS

U. S. Tandon et al., "Granulation of silicon surface through reactive ion etching," Journal of Vacuum Science and Technology: Part B, vol. 10, No. 6, Nov./Dec. 1992, pp. 2419-2421.
"Controlled Surface Texturing of Materials," IBM Technical Disclosure Bulletin, IBM Corp., vol. 34, No. 5, Oct. 1, 1991, pp. 381-382.

* cited by examiner

*Primary Examiner* — Nguyen T Ha

(57) ABSTRACT

Capacitive coupling devices and methods of fabricating a capacitive coupling device are disclosed. The coupling device could include a stack of layers forming electrodes and at least one insulator. The insulator could include a region of doped silicon. The silicon could be doped with a species selected from Ce, Cr, Co, Cu, Dy, Er, Eu, Ho, Ir, Li, Lu, Mn, Pr, Rb, Sm, Sr, Tb, Tm, Yb, Y, Ac, Am, Ba, Be, Cd, Gd, Fe, La, Pb, Ni, Ra, Sc, Th, Hf, Tl, Sn, Np, Rh, U, Zn, Ag, and Yb in relief and forming roughnesses relative to the neighboring regions of the same level in the stack. The electrodes and the insulator form conformal layers above the doped silicon region.

19 Claims, 2 Drawing Sheets

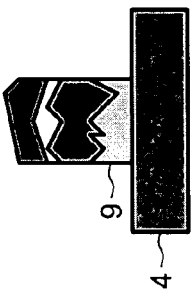
FIG.2d
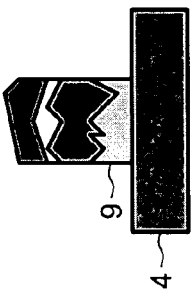
FIG.2c
FIG.2b
FIG.2a
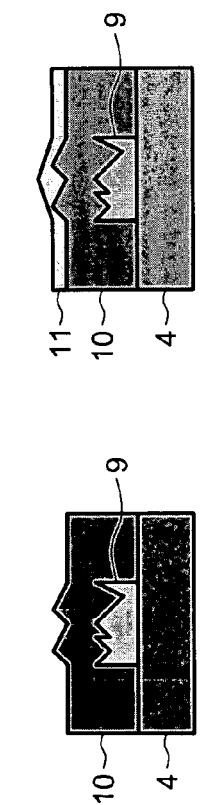
FIG.2h
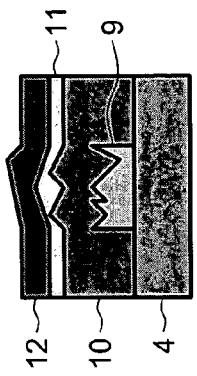
FIG.2g
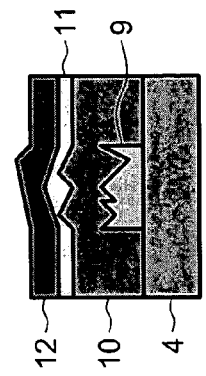
FIG.2f
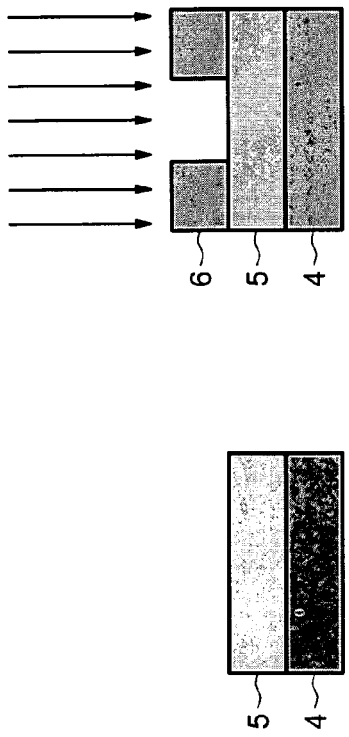
FIG.2e

INCREASING THE CAPACITANCE OF A CAPACITIVE DEVICE BY MICROMASKING

CROSS-REFERENCE TO RELATED APPLICATIONS

The present application is related to French Patent Application No. 0753625, filed Mar. 2, 2007, entitled "INCREASING THE CAPACITANCE OF A CAPACITIVE DEVICE BY MICROMASKING". French Patent Application No. 0753625 is assigned to the assignee of the present application and is hereby incorporated by reference into the present disclosure as if fully set forth herein. The present application hereby claims priority under 35 U.S.C. §119(a) to French Patent Application No. 0753625.

TECHNICAL FIELD

The present disclosure relates to the field of microelectronics, and more particularly to capacitors in microelectronics.

BACKGROUND

The miniaturization of these systems in order to increase the integration density is pushing the electrical properties of these components to their limits. In the case of capacitors, the parallel aim of the miniaturization is to maintain the insulating capacities of the dielectric. The capacitors are generally used for temporarily storing a value, or bit, in the form of a charge which is present or absent. It is therefore crucial that the state of charge can persist for a sufficiently long time in relation to the information processing times.

During miniaturization, the surface occupied by a capacitor decreases, the direct effect of which is that the value of the capacitance associated with it is reduced. In order to keep the capacitance at an acceptable value, either the relative permittivity of the oxide may be increased or the contact surface between the electrodes may be increased. Studies carried out during the miniaturization of transistors have revealed a vast range of materials with a high dielectric constant. These materials, however, present great integration difficulties.

Examples which may be mentioned among these high dielectric constant materials are tantalum oxide $Ta_2O_5$ "Journal of The Electrochemical Society, 153 (5) G492-G497 (2006)", or yttrium oxides "J. Vac. Sci. Technol. A 24(3) (2006)".

In parallel with this, increasing the contact surface has been investigated and several ways have been proposed in which the contact surface between a dielectric and metal electrodes can be increased. A common feature of these methods involves increasing the roughness of the lower electrode in conjunction with conformally depositing the dielectric and the upper electrode.

Mention may be made of hemispherical silicon grains, obtained by vapour deposition of amorphous silicon at a temperature at least equal to 550° C. followed by recrystallization at the same temperature. Depending on the surface density of these hemispherical silicon grains, the increase in free surface for a constant occupation surface may reach a factor of two, according to document "J. Appl. Phys. 71 (7), 1 Apr. 1992".

Document "Journal of The Electrochemical Society, 148 (8) F170-F174 (2001)" discloses other conditions for producing an electrode comprising hemispherical silicon grains, in particular by using ozone.

Another method for generating roughness capable of increasing the contact surface of the dielectric consists in the use of a micromasking effect during reactive ion etching.

Micromasking consists in redepositing some of the ions coming from the plasma in the form of carbon polymers. These polymers then fulfil the function of a mask for the subsequent etching steps. The deposited polymer film does not have a uniform thickness. The etching time of the polymer film varies with the thickness. Silicon and the polymer film have different etching rates. Thus, when all the polymer at a given point has been etched, the etching continues in silicon at a higher rate. The thickness difference of the polymer film is thus amplified when etching the silicon layer. Furthermore, if the reactive ion etching has a pronounced chemical nature, i.e. if the etching is isotropic, then etching in the silicon is accompanied by lateral undercut etching capable of rounding the reliefs. The thickness inhomogeneities of the polymer film are thus converted into hemispherical shapes and not into columns, as expected in the case of anisotropic etching. The term chemical nature of the etching is intended to mean etching in which the reactions of the ions coming from the plasma with the materials to be etched are predominant over impact of the accelerated ions with the materials to be etched.

Documents "Journal of Vacuum Science Technology B 8(6) 1990" and "Journal of Vacuum Science Technology B 10(6) 1992" describe a micromasking effect obtained when etching silicon by reactive ion etching using a plasma originating from halides in gaseous form. The micromasking is exhibited only with certain combinations of materials to be etched, temperature, pressure, energy of the plasma, charge of the substrate, form factor and nature of the precursors of the plasma.

Hemispherical silicon grains are obtained in both cases, the surface density and size of which are controlled by the production conditions. The roughness thus induced makes it possible to increase the contact surface between the dielectric and the metal electrodes.

Lastly, another approach consists in combining a high dielectric constant material and roughness at the interface between the dielectric and the metal electrodes.

Document "J. Vac. Sci. Technol. B 19(1) (2001)" describes the use of a (Ba,Sr)$TiO_3$ dielectric film coupled with (Ba,Sr)$RuO_3$ electrodes. The (Ba,Sr)$TiO_3$ film has a high extinction coefficient. The extinction coefficient corresponds to the complex part of the refractive index and is directly related to the dielectric constant. In the cited document, the (Ba,Sr)$RuO_3$ electrodes undergo annealing which generates surface roughness capable of increasing the contact surface between the dielectric and the electrodes.

These methods present the drawback of a large heat budget, making the process difficult to integrate for the production of interconnection lines in microelectronic devices, for example memories of the DRAM type, particularly owing to the risk of deactivating the dopants used in transistors having a gate length of less than 90 nm. These methods also present the drawback of large sizes, greater than the dimensions of several capacitive devices, or nonuniform curvature compromising reproducibility and reliability from one device to another.

SUMMARY

It is an object of the present disclosure to increase the value of the capacitance of a capacitive device by increasing the contact surface between the metal electrodes and the dielectric.

In one embodiment, the present disclosure provides a capacitive coupling device. The capacitative coupling device could include a stack of layers forming electrodes. The device could also include at least one insulator. The device could further include a substrate having a doped silicon region forming roughness relative to the neighbouring regions of the same level in the stack. The electrodes and the insulator form conformal layers above the said region.

In another embodiment, the present disclosure provides a method of fabricating a capacitor. The method could include depositing, on a substrate, metal and dielectric layers forming electrodes and an insulator in a structure of the Metal-Insulator-Metal type, wherein the layers comprises roughness. The method also includes depositing an amorphous doped silicon layer. The method could further include anisotropically etching in order to obtain a rough layer. The method could still further include depositing conductive and dielectric layers conformally.

In still another embodiment, the present disclosure provides a method of fabricating a capacitor. The method includes depositing, on a substrate, metal and dielectric layers forming electrodes and an insulator in a structure of the Metal-Insulator-Metal type, wherein the layers comprises roughness. The method includes could also depositing an amorphous doped silicon layer formed by ion implantation. The method could still further include anisotropically etching in order to obtain a rough layer. The method could also include depositing conductive and dielectric layers conformally.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which:

FIGS. 2A to 2H show somewhat simplified schematic diagrams of the main steps in the method for producing a capacitive device according to one embodiment of the present disclosure.

DETAILED DESCRIPTION

Figure 1:
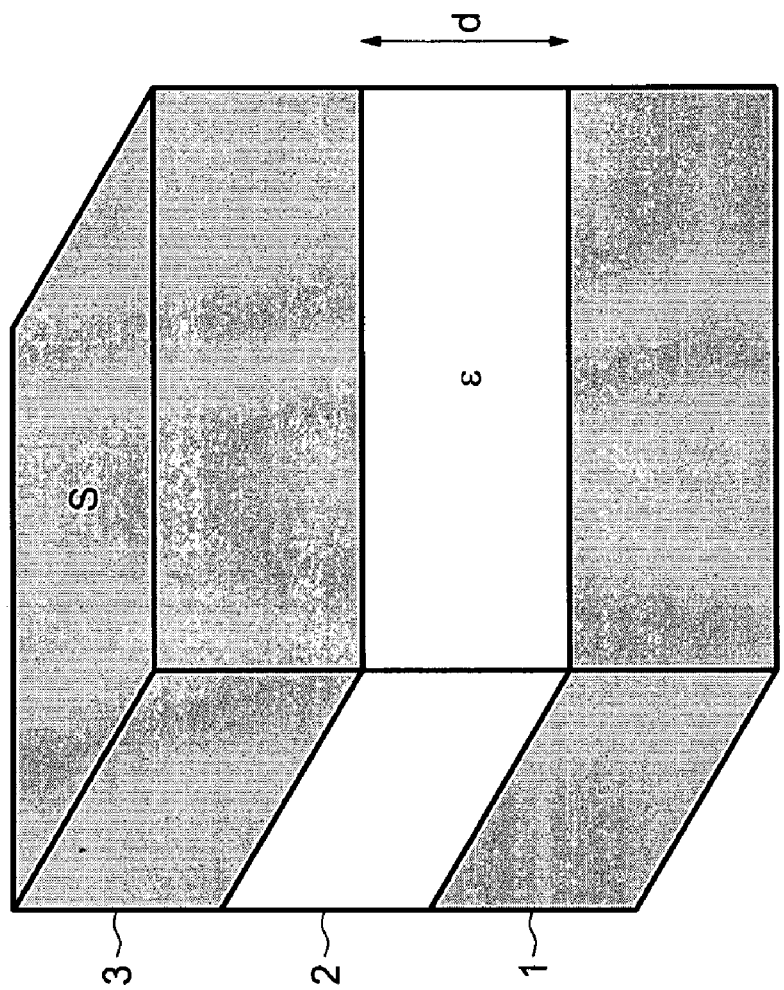
FIG. 1 is a somewhat simplified schematic diagram of a capacitive device according to one embodiment of the present disclosure.

In FIG. 1, a first metal layer 1 used as a lower electrode on which a layer of dielectric material 2 is deposited. The device is completed by a metal layer 3 on the dielectric material layer 2.

Applying a voltage U between the two metal electrodes generates an accumulation of charges Q at the interfaces with the dielectric material layer 2. The capacitance C of a capacitive device shown by Equation 1 below.

$$Q = C * U \quad \text{(Eqn. 1)}$$

The capacitance C depends on the structure of the device, both the nature of the dielectric material and the dimensions of the layers.

C is defined as shown in Equation 2 below.

$$C = \epsilon * S / d \quad \text{(Eqn. 2)}$$

In Equation 2, $\epsilon$=permittivity, S=contact surface between the electrodes and the dielectric material layer and d=thickness of the dielectric layer.

The contact surface S is intended to be increased by increasing the roughness of the layers. Furthermore, the proposed approach makes it possible to combine an increase in contact surface S with the majority of capacitive devices already existing, including those with a high permittivity. It is thus possible to increase the value of the variables on which the capacitance C depends.

FIGS. 2A to 2H generally show the various steps of the fabrication method according to one embodiment of the present disclosure.

A layer of amorphous silicon 5 is deposited on a substrate 4, in particular of silicon oxide. A mask 6 is created, which is capable of delimiting the zone in which the ion doping is intended to be carried out. For example, but without implying any limitation, the mask 6 may be a photosensitive polymer resin or a silicon nitride mask, preferably a photosensitive resin. Since the doping is carried out by ion implantation, the thickness of the mask is determined according to its effectiveness in stopping ions with the implantation energy.

The ion implantation is carried out by bombardment with ions accelerated at a voltage of between 1 keV and 50 keV, preferably 40 keV and with a dose of between $10^{13}$ and $10^{16}$ at/cm². Depending on the implantation energy, the ions will lie at a greater or lesser depth from the surface. After implantation, the mask 6 is removed. The implantation is localized and limited to the zone 8.

As illustrated in FIG. 2C, reactive ion etching is carried out during which a plasma 7 makes it possible to etch the silicon layer 5 comprising the doped zone 8 according to one embodiment of the present disclosure. Such a plasma is generally obtained by radiofrequency excitation of a gaseous mixture of fluorinated halogenated gases such as $S_xF_y$ or $C_zF_wX_v$ with X a halogen other than fluorine, more particularly $SF_6$, $CF_4$ or HBr. These halogens are decomposed into ions, in particular F⁻, which react with the species to be etched and form volatile components eliminated with the continuous replenishment of the atmosphere of the etching reactor.

The implanted ions, however, are selected so that the compounds formed during the etching have an evaporation temperature in excess of 400° C., a temperature which is higher than the temperature at which the method is carried out. The implanted ions may come from the following atoms, Ce, Cr, Co, Cu, Dy, Er, Eu, Ho, Ir, Li, Lu, Mn, Pr, Rb, Sm, Sr, Tb, Tm, Yb, Y, Ac, Am, Ba, Be, Cd, Gd, Fe, La, Pb, Ni, Ra, Sc, Th, Hf, Tl, Sn, Np, Rh, U, Zn, Ag, preferably Yb. The compounds formed between these ions and the halide ions are nonvolatile and remain on the surface, locally passivating the silicon against etching phenomena. This passivation is also referred to as micromasking and makes it possible to generate roughness in the amorphous silicon layer 5.

While the form factor is dictated by the ratio between the implantation depth of the ions and the thickness of the amorphous silicon layer 5, the shape of the roughness depends on the physicochemical nature of the etching. In general, more physical etching presents an etching profile with a shallow slope, while for chemical etching the etching profile presents a steep slope and rounding of the contours. The etching used does not require a precise physicochemical nature, although a chemical approach may be favoured in order to obtain gentler transitions between etched zones and passivated zones, which are more conducive to the deposition of conformal layers. The etching is stopped when all the amorphous silicon outside the implanted zone 8 has been removed. A rough layer 9 of amorphous silicon is thus obtained. The asperities have a height of between 15 and 20 nm, a width of between 5 and 10 nm and an inter-roughness distance of from 2 to 3 nm. These values may be adjusted according to the various parameters of the method.

The rough layer 9 of amorphous silicon is used as a support for production of the capacitive device according to one embodiment of the present disclosure. To this end, surface-wide deposition of metal and dielectric is successively carried out. The first layer is a metal layer with a thickness of between 10 and 30 nm. The second layer is a dielectric layer with a thickness of between 4 and 20 nm. The second layer is similar to the first. The capacitive device is completed by removing the metal in contact with the substrate 4, while preserving the metal layers and the dielectric which have been deposited on the rough layer 9.

Accordingly, in one embodiment, the present disclosure provides a method that makes it possible to produce a capacitive device of high capacitance value with a small size and a low heat budget. An amorphous silicon layer comprising roughness is obtained by micromasking with a species which is inert in relation to the reactive ion etching. This rough layer may then be used as a support for producing a capacitor by conformal deposition of metal and dielectric layers, the thicknesses being selected in order to preserve the roughness and to increase the capacitance of the capacitive device.

In one embodiment, the method makes it possible to significantly increase the effective contact surface between the electrodes and the dielectric, allowing the capacitance of the device to be increased.

The roughness may be modulated by modifying the dose of implanted ions, as well as the implantation depth via the implantation energy.

In one embodiment, the method makes it possible to produce planar capacitive devices, although it may also be applied to U-shaped capacitive devices, for example for the lower cell of DRAMs.

Accorinly, in one embodiment, the present disclosure generally provides a method for generating regular roughness and a high form factor from an amorphous silicon layer, with a low heat budget and without modifying the materials used in the fabrication of the capacitive device.

In one embodiment, the present disclosure provides a capacitive coupling device that comprises a stack of layers forming electrodes and at least one insulator. The substrate comprises a region of silicon doped with a species selected from Ce, Cr, Co, Cu, Dy, Er, Eu, Ho, Ir, Li, Lu, Mn, Pr, Rb, Sm, Sr, Tb, Tm, Yb, Y, Ac, Am, Ba, Be, Cd, Gd, Fe, La, Pb, Ni, Ra, Sc, Th, Hf, Tl, Sn, Np, Rh, U, Zn, Ag, and Yb, in relief and forming roughnesses relative to the neighbouring regions of the same level in the stack, the electrodes and the insulator forming conformal layers above the said region.

The doped silicon region may have roughness with a height of between 10% and 80% of the thickness of a layer of the stack. The doped silicon region is preferably doped with ytterbium. The doped silicon region and the stack of layers are produced on a substrate, the doped silicon region being in relief relative to the substrate.

In another embodiment, the present disclosure provides a method for fabricating a capacitor may comprise the deposition, on a substrate, of metal and dielectric layers forming electrodes and an insulator in a structure of the Metal-Insulator-Metal type, the said layers comprising roughness. An amorphous silicon layer is deposited, which is doped with a species selected from the following species: Ce, Cr, Co, Cu, Dy, Er, Eu, Ho, Ir, Li, Lu, Mn, Pr, Rb, Sm, Sr, Tb, Tm, Yb, Y, Ac, Am, Ba, Be, Cd, Gd, Fe, La, Pb, Ni, Ra, Sc, Th, Hf, Tl, Sn, Np, Rh, U, Zn, Ag, and Yb. The doped silicon layer is etched isotropically in order to obtain a rough layer, on which conductive and dielectric layers are deposited conformally.

The doping may be carried out locally by using a resin mask. Ion implantation may be used for doping the amorphous silicon layer. The ions may be implanted with an energy of between 1 keV and 50 keV, and preferably between 25 and 40 keV.

The doping may be carried out with a species selected from those species which can form a halogen compound with a melting temperature of between 400° C. and 2000° C., preferably between 600 and 1000° C. The doping may preferably be carried out with ytterbium.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A capacitive coupling device comprising:
   a stack of layers, at least two of the layers forming electrodes, at least one of the layers forming an insulator between the electrodes; and
   a substrate having a doped silicon region forming roughness relative to neighboring regions of the same level in the stack, the roughness of the doped silicon region formed by a reactive ion etching process,
   wherein the electrodes and the insulator form conformal layers above the doped silicon region.

2. The device according to claim 1, wherein the doped silicon region is doped with at least one of: Ce, Cr, Co, Cu, Dy, Er, Eu, Ho, Ir, Li, Lu, Mn, Pr, Rb, Sm, Sr, Tb, Tm, Yb, Y, Ac, Am, Ba, Be, Cd, Gd, Fe, La, Pb, Ni, Ra, Sc, Th, Hf, Tl, Sn, Np, Rh, U, Zn, and Ag.

3. The device according to claim 1, wherein the doped silicon region includes a roughness with a height of between 10% and 80% of the thickness of one of the layers of the stack.

4. The device according to claim 1, wherein the doped silicon region is doped with ytterbium.

5. The device according to claim 1, wherein the doped silicon region and the stack of layers are produced on the substrate, the doped silicon region being in relief relative to the substrate.

6. A capacitor comprising:
   a substrate having a doped silicon region forming roughness relative to neighboring regions of the same level in the stack, the roughness of the doped silicon region formed by a reactive ion etching process;
   a first electrode layer conformally formed on the doped silicon region;
   an insulating layer conformally formed on the first electrode layer; and
   a second electrode layer conformally formed on the insulating layer.

7. The capacitor according to claim 6, wherein the doped silicon region is doped with at least one of: Ce, Cr, Co, Cu, Dy, Er, Eu, Ho, Ir, Li, Lu, Mn, Pr, Rb, Sm, Sr, Tb, Tm, Yb, Y, Ac, Am, Ba, Be, Cd, Gd, Fe, La, Pb, Ni, Ra, Sc, Th, Hf, Tl, Sn, Np, Rh, U, Zn, and Ag.

8. The capacitor according to claim 6, wherein the doped silicon region includes a roughness with a height of between 10% and 80% of the thickness of one of the layers of the stack.

9. The capacitor according to claim 6, wherein the doped silicon region is doped with ytterbium.

10. The capacitor according to claim 6, wherein the doped silicon region and the stack of layers are produced on the substrate, the doped silicon region being in relief relative to the substrate.

11. The capacitor according to claim 6, wherein the first electrode layer and the second electrode layer each have a thickness that ranges from 10 to 30 nanometers.

12. The capacitor according to claim 6, wherein the insulating layer has a thickness that ranges from 4 to 20 nanometers.

13. An integrated circuit comprising:
a capacitive element comprising:
a stack of layers, at least two of the layers forming electrodes, at least one of the layers forming an insulator between the electrodes; and
a substrate having a doped silicon region forming roughness relative to neighboring regions of the same level in the stack, the roughness of the doped silicon region formed by a reactive ion etching process,
wherein the electrodes and the insulator form conformal layers above the said doped silicon region.

14. The integrated circuit according to claim 13, wherein the doped silicon region is doped with at least one of: Ce, Cr, Co, Cu, Dy, Er, Eu, Ho, Ir, Li, Lu, Mn, Pr, Rb, Sm, Sr, Tb, Tm, Yb, Y, Ac, Am, Ba, Be, Cd, Gd, Fe, La, Pb, Ni, Ra, Sc, Th, Hf, Tl, Sn, Np, Rh, U, Zn, and Ag.

15. The integrated circuit according to claim 13, wherein the doped silicon region includes a roughness with a height of between 10% and 80% of the thickness of one of the layers of the stack.

16. The integrated circuit according to claim 13, wherein the doped silicon region is doped with ytterbium.

17. The integrated circuit according to claim 13, wherein the doped silicon region and the stack of layers are produced on the substrate, the doped silicon region being in relief relative to the substrate.

18. The integrated circuit according to claim 13, wherein the first electrode layer and the second electrode layer each have a thickness that ranges from 10 to 30 nanometers.

19. The integrated circuit according to claim 13, wherein the insulating layer has a thickness that ranges from 4 to 20 nanometers.

* * * * *